(12) United States Patent
Song

(10) Patent No.: US 7,183,803 B2
(45) Date of Patent: Feb. 27, 2007

(54) INPUT DEVICE FOR A SEMICONDUCTOR DEVICE

(75) Inventor: Ho Uk Song, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 82 days.

(21) Appl. No.: 10/963,283

(22) Filed: Oct. 12, 2004

(65) Prior Publication Data

US 2005/0242838 A1    Nov. 3, 2005

(30) Foreign Application Priority Data

Apr. 28, 2004    (KR) .......................... 2004-0029595

(51) Int. Cl.
*H03K 19/0175* (2006.01)

(52) U.S. Cl. ............................ 326/82; 326/83; 326/86; 326/87

(58) Field of Classification Search ............. 326/22–24, 326/82–83, 86–87
See application file for complete search history.

(56) References Cited

U.S. PATENT DOCUMENTS 6,466,055 B1 * 10/2002 Gaboury ...................... 326/83

* cited by examiner

*Primary Examiner*—Rexford Barnie
*Assistant Examiner*—Jason Crawford
(74) *Attorney, Agent, or Firm*—Ladas & Parry LLP

(57) ABSTRACT

Disclosed is an input device for a semiconductor device that optimizes the performance characteristic of the semiconductor device using off-chip driver information. The input device includes at least two buffers, connected in parallel to an electrostatic discharge (ESD) circuit, for buffering an input signal applied through the ESD circuit. The buffers have delay times different from each other, one of the buffers is selected using off-chip driver information detected from an output driver and the input signal is transferred through the selected buffer. The signal transfer path of the input device is optionally be selected using the off-chip driver information of the output drivers, and a stable input/output operation of the semiconductor device is achieved even if the performance characteristic of the semiconductor device is changed due to the skew occurring in the fabricating process of the semiconductor device.

14 Claims, 6 Drawing Sheets

INPUT DEVICE FOR A SEMICONDUCTOR DEVICE

BACKGROUND OF THE INVENTION

1. Field of the Invention

The present invention relates to an input buffer for a semiconductor device, and more particularly to an input device for a semiconductor device which can improve the performance characteristic of the semiconductor device by applying OCD (Off-Chip Driver) information to the input buffer.

2. Description of the Prior Art

As generally known in the art, the performance of a semiconductor device may deteriorate due to skew that occurs in the fabricating process of the semiconductor device. This performance deterioration due to the skew becomes severer as the integration and speed of a semiconductor device increase.

In order to prevent the performance deterioration of an interface unit due to the skew, a conventional semiconductor device applies OCD (Off-Chip Driver) information to an output driver.

The OCD information means information about an impedance value of the output driver of the semiconductor device.

The OCD information will be explained in more detail.

Generally, the output driver of the semiconductor device does not have a constant output impedance value due to the skew phenomenon caused by variation of processing parameters. Accordingly, a designer of the semiconductor device checks the variation of the output impedance of the output driver and controls the checked output impedance of the output driver so that the output impedance matches an input impedance of an external system. Information about the performance characteristics of the output driver obtained by the above-described impedance matching is the OCD information. In other words, the OCD information includes information about the skew of the semiconductor device.

According to the related art, if the impedance characteristic of the output driver of the semiconductor device is changed due to the skew occurring in the fabricating process of the semiconductor device, the impedance of the output driver is adjusted using the OCD information as described above. However, any apparatus for adjusting the skew of the input device by applying the OCD information to the input device of the semiconductor device has not been proposed.

As shown in FIG. 1, a conventional input device of a semiconductor device typically includes an ESD (Electro-Static Discharge) circuit 100, a receiver 110, a setup-hold delay unit 120 and a latch 130. In FIG. 1, the input device has no construction for correcting the skew.

Accordingly, if the performance characteristic of the input device of the semiconductor device is changed due to the skew occurring in the fabricating process of the semiconductor device as shown in FIG. 1, the input signal changed by the skew affects the semiconductor device as it is.

Consequently, the performance characteristic of the semiconductor device deteriorates due to the skew, and this performance deterioration due to the skew becomes more severe in the case of a high-speed semiconductor device.

SUMMARY OF THE INVENTION

Accordingly, the present invention has been made to solve the above-mentioned problems occurring in the prior art, and an object of the present invention is to provide an input device for a semiconductor device which can adjust skew using OCD (Off-Chip Driver) information.

Another object of the present invention is to provide an input device for a semiconductor device which can adjust the characteristic of the input device according to skew occurring in the fabricating process of the semiconductor memory device using OCD information adopted in the semiconductor memory device above a DDR2 SDRAM class.

Still another object of the present invention is to provide an input device for a semiconductor device which can adjust the delay time of the input device using OCD information.

In order to accomplish these objects, there is provided an input device for a semiconductor device, comprising at least two buffers, connected in parallel to an electrostatic discharge (ESD) circuit, for buffering an input signal applied through the ESD circuit, the buffers having delay times different from each other, wherein one of the buffers is selected using off-chip driver information detected from an output driver and the input signal is transferred through the selected buffer.

In another aspect of the present invention, there is provided an input device for a semiconductor device, comprising a switching unit for receiving an input signal through an electrostatic discharge (ESD) circuit and performing a switching operation of the input signal according to off-chip driver information detected from an output driver, and at least two buffers connected in parallel to the switching unit, having delay times different from each other and buffering the transferred input signal, wherein the switching unit selects one of the buffers according to the off-chip driver information and transfers the input signal through the selected buffer.

In still another aspect of the present invention, there is provided an input device for a semiconductor device, comprising a receiver for receiving and converting an input signal inputted from an outside through an electrostatic discharge (ESD) circuit into an internal voltage, a switching unit for performing a switching operation of the input signal according to off-chip driver information detected from an output driver, at least two setup-hold delay units connected in parallel to the switching unit, having delay times different from each other and adjusting a setup time and a hold time of the transferred input signal, and a latch for latching signals outputted from the at least two setup-hold delay units, wherein the switching unit selects one of the setup-hold delay units according to the off-chip driver information and transfers the input signal through the selected setup-hold delay unit.

In still another aspect of the present invention, there is provided an input device for a semiconductor device, comprising a receiver for receiving and converting an input signal inputted from an outside through an electrostatic discharge (ESD) circuit into an internal voltage, at least two setup-hold delay units, connected in series, for adjusting a setup time and a hold time of the input signal, at least two switching units connected in parallel to the setup-hold delay units in a one-to-one manner, for performing a switching operation so as to include the corresponding setup-hold delay unit as a path according to off-chip driver information detected from an output driver, and a latch for latching signals outputted from the final-stage setup-hold delay unit, wherein the switching unit selects at least one of the setup-hold delay units according to the off-chip driver information and transfers the input signal through the selected setup-hold delay unit.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
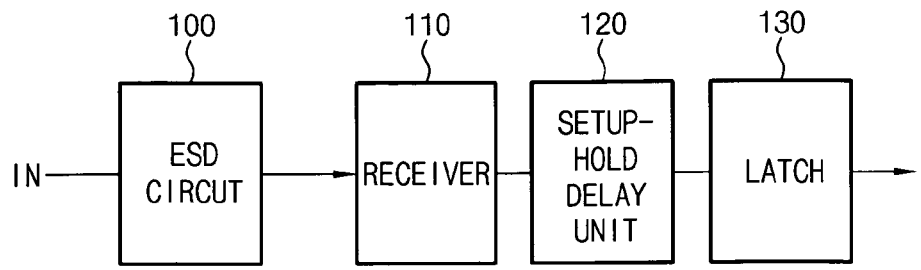
FIG. 1 is a block diagram illustrating the construction of a conventional semiconductor device.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
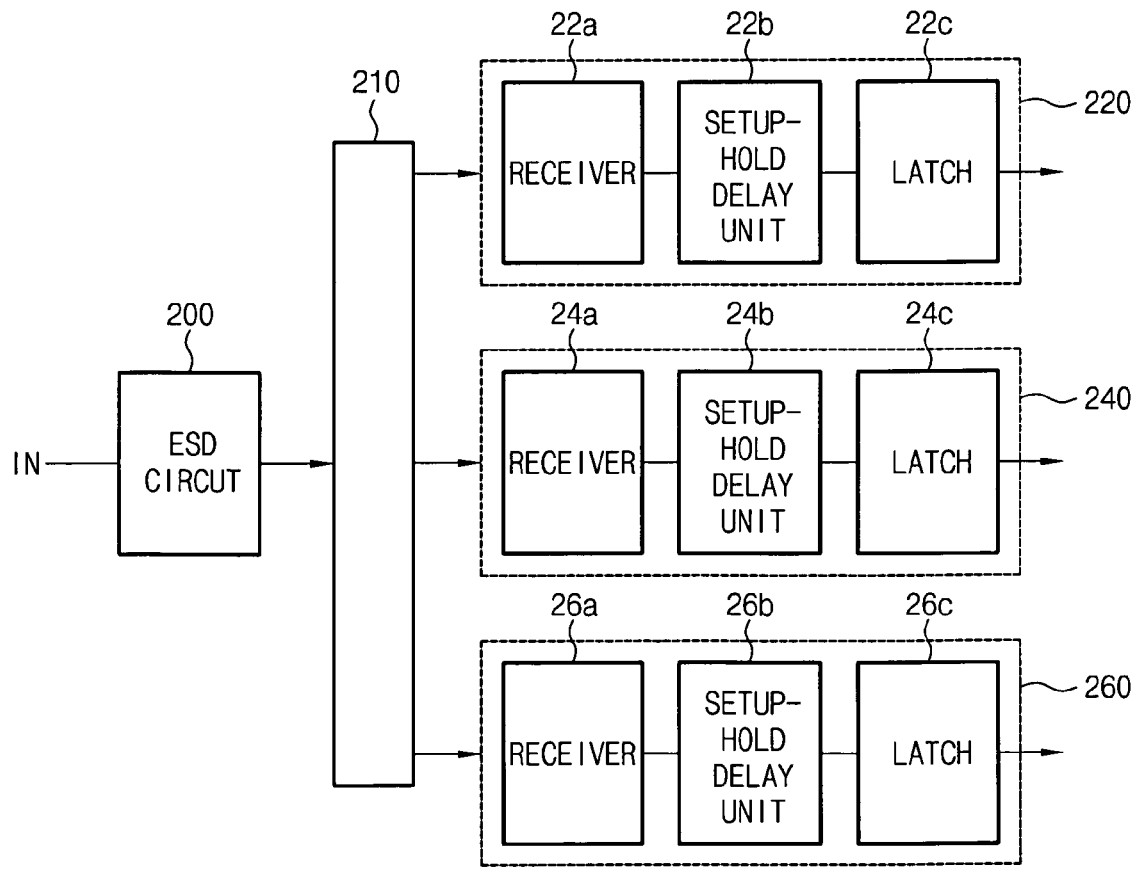
FIG. 2 is a block diagram illustrating the construction of an input device for a semiconductor device according to a first embodiment of the present invention.

FIG. 2 is a block diagram illustrating the construction of an input device for a semiconductor device according to a first embodiment of the present invention.

Referring to FIG. 2, the input device for a semiconductor device according to the present invention includes an ESD circuit 200, a switching unit 210 and buffers 220, 240 and 260. The switching unit 210 outputs an output of the ESD circuit 200 to one of the buffers 220, 240 and 260 according to off-chip driver information. The buffer 220 is provided with a receiver 22a, a setup-hold delay unit 22b and a latch 22c. The buffer 240 is provided with a receiver 24a, a setup-hold delay unit 24b and a latch 24c. The buffer 260 is provided with a receiver 26a, a setup-hold delay unit 26b and a latch 26c.

The ESD circuit 200 protects internal circuits of the semiconductor device from static electricity applied from the outside.

The switching unit 210 outputs an output of the ESD circuit 200 to one among the buffers 220, 240 and 260 according to the off-chip driver information.

The receivers 22a, 22b and 22c receives an external input signal IN inputted through the ESD circuit and converts the input signal into an internal voltage of the semiconductor device (i.e., serves to perform a buffer function). The setup-hold delay units 22b, 24b and 26b are composed of delay circuits for adjusting setup times and hold times of signals outputted from the receivers 22a, 22b and 22c. The latches 26a, 26b and 26c latch output signals of the setup-hold delay units 22b, 24b and 26b.

In FIG. 2, the performance characteristics of the receivers 22a, 22b and 22c may be identical to one another or may be different from one another. In the embodiment of the present invention, it is assumed that the performance characteristics of the receivers 22a, 22b and 22c are identical to one another. Meanwhile, delay times of the setup-hold delay units 22b, 24b and 26b are different from one another. In FIG. 2, the setup-hold delay unit 22b has the shortest delay time, and the setup-hold delay unit 26b has the longest delay time. The setup-hold delay unit 24b has an intermediate delay time that is between the delay time of the setup-hold delay unit 22b and the delay time of the setup-hold delay unit 26b. It is assumed that the performance characteristics of the latches 26a, 26b and 26c are identical to one another.

In operation, the input signal IN having passed the ESD circuit 200 is transferred to any one of the buffers 220, 240 and 260 according to the operation of the switching unit 210, and in this case, a signal transfer path is determined by the off-chip driver information.

For example, if it is judged that the semiconductor device has scarcely any skew (i.e., in the case that the fabricating process has been performed within an error range desired by a designer), the input signal is applied to the buffer 240. If it is judged that the skew is slow, the input signal is applied to the buffer 220. If it is judged that the skew is fast, the input signal is applied to the buffer 260.

Here, the fact that the skew is slow means that the performance of the semiconductor device is slower than the average value thereof due to the skew occurring in the fabricating process, and the fact that the skew is fast means that the performance of the semiconductor device is faster than the average value thereof due to the skew occurring in the fabricating process.

Figure 3:
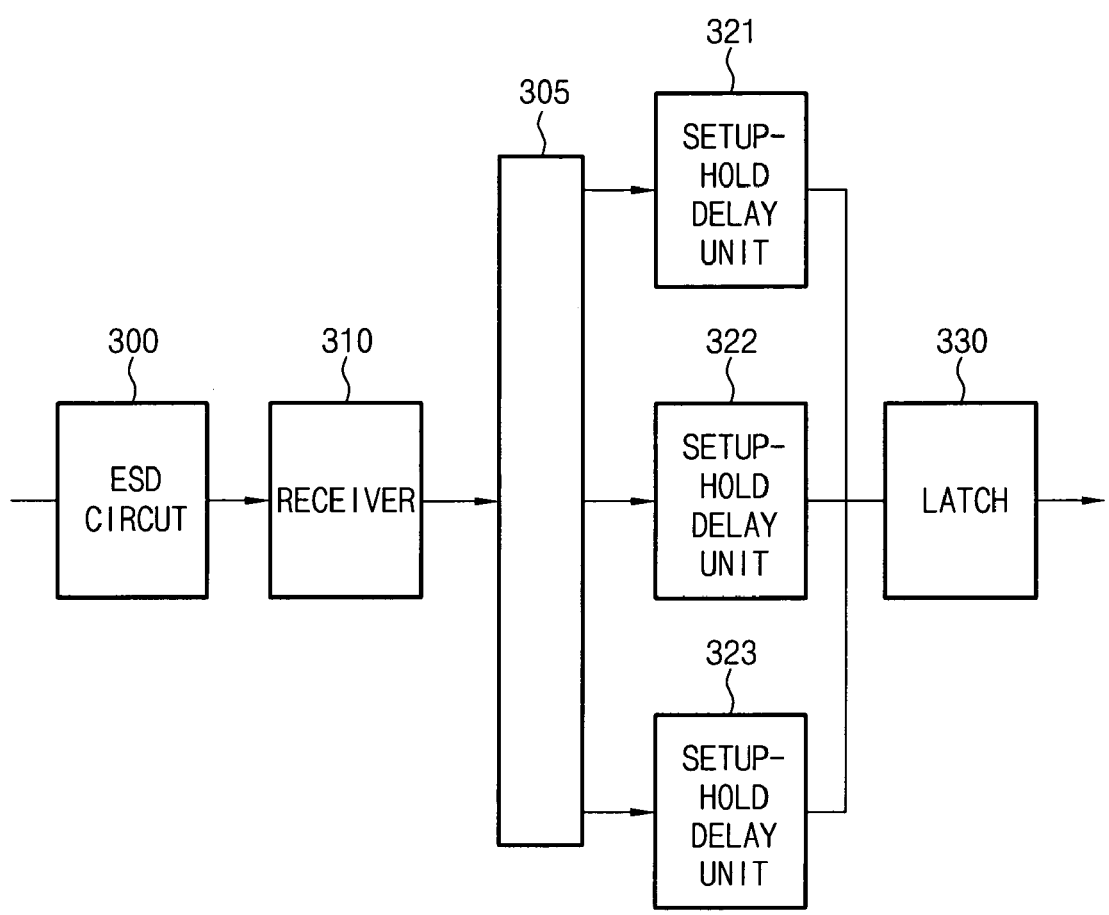
FIG. 3 is a block diagram illustrating the construction of an input device for a semiconductor device according to a second embodiment of the present invention.

Although three buffers are illustrated in FIG. 3, the number of buffers may be increased in order to select a more preferable signal transfer path.

Meanwhile, FIG. 3 is a block diagram illustrating the construction of an input device for a semiconductor device according to a second embodiment of the present invention.

As shown in FIG. 3, the input device for a semiconductor device according to the present invention includes an ESD circuit 300, a receiver 310, a switching unit 305, setup-hold delay units 321, 322 and 323 connected in parallel to one another and a latch 330.

In FIG. 3, the delay times of the setup-hold delay units 321, 322 and 323 are set to be different from one another. The switching unit 305 determines the output path according to the degree of skew detected according to the off-chip driver information. That is, the input signal passes through one among the setup-hold delay units 321, 322 and 323 according to the degree of skew.

The embodiment of FIG. 3 has the advantage that it can reduce the area occupied by the input device in comparison to the embodiment of FIG. 2.

Figure 4:
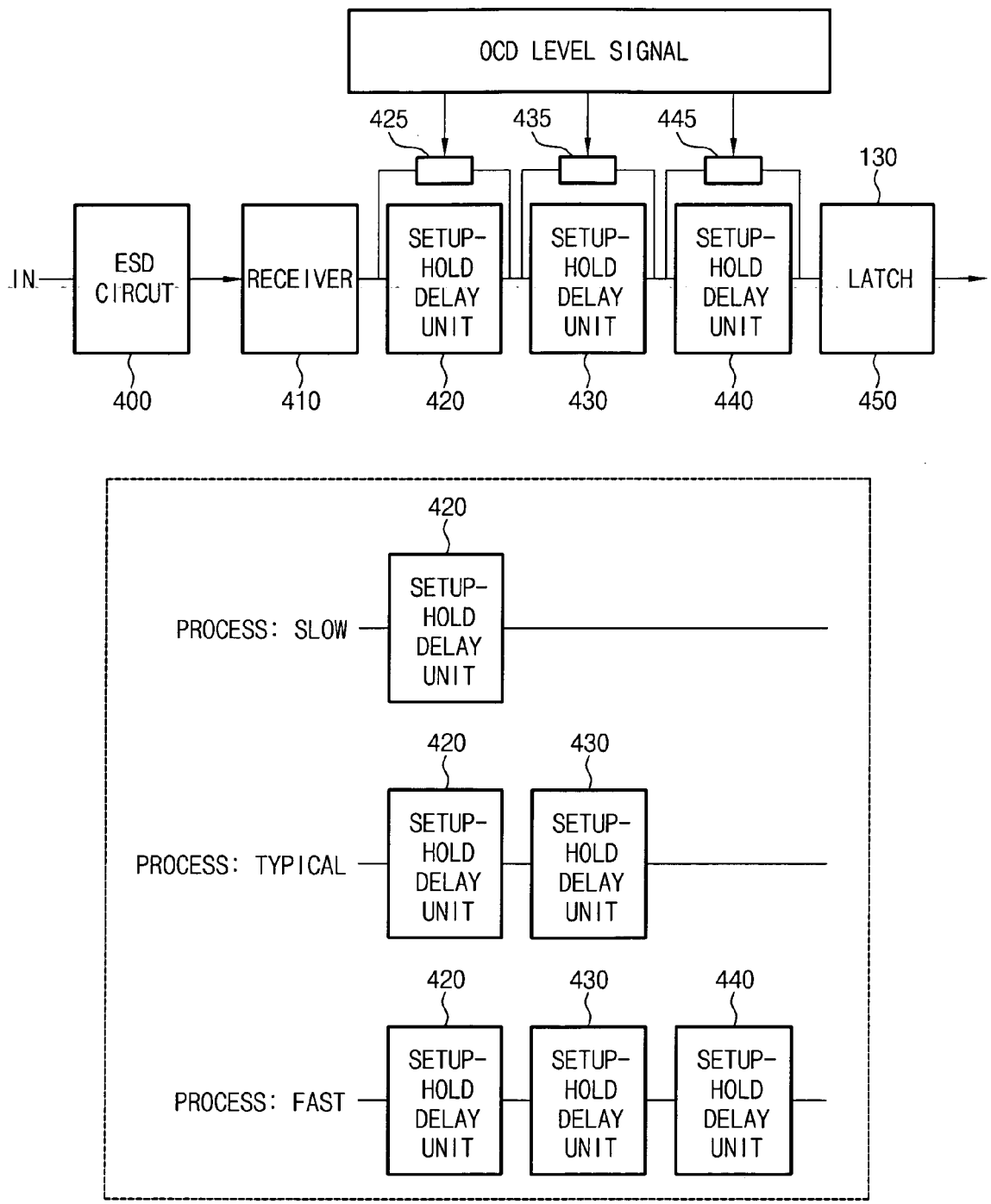
FIG. 4 is a block diagram illustrating the construction of an input device for a semiconductor device according to a third embodiment of the present invention.

FIG. 4 is a block diagram illustrating the construction of an input device for a semiconductor device according to a third embodiment of the present invention.

The input device for a semiconductor device according to the embodiment of FIG. 4 includes an ESD circuit 400, a receiver 410, setup-hold delay units 420, 430 and 440 connected in series to one another and a latch 450. Also, switching units 425, 435 and 445 are connected in parallel to the setup-hold delay units 420, 430 and 440, respectively, and the switching units 425, 435 and 445 perform a switching operation according to the off-chip driver information.

In FIG. 4, the delay times of the setup-hold delay units 420, 430 and 440 are set to be equal to one another. However, they may be set to be different from one another as needed.

As shown in FIG. 4, it can be known that only a part of the setup-hold delay units is selected according to the off-chip driver information.

First, if the skew is slow, the switching unit 425 is turned off and the switching units 435 and 445 are turned on. Accordingly, the input signal is transferred to the latch 450 after passing through the setup-hold delay unit 420. If the skew is average, the switching units 425 and 435 are turned off and the switching unit 445 is turned on. Thus, the input signal is transferred to the latch 450 after passing through the setup-hold delay units 420 and 430. Next, if the skew is fast, the switching units 425, 435 and 445 are turned off. Accordingly, the input signal is transferred to the latch 450 after passing through the setup-hold units 420, 430 and 440.

Here, the fact that the skew is slow means that the performance of the semiconductor device is slower than the average value thereof, and the fact that the skew is fast means that the performance of the semiconductor device is faster than the average value thereof.

Accordingly, if the skew is slow, the operating speed is increased by shortening the delay time obtained through the setup-hold delay unit, while if the skew is fast, the operating speed is reduced by lengthening the delay time through the setup-hold delay unit. Accordingly, the performance of the semiconductor device is kept constant irrespective of the skew occurrence.

The off-chip driver information used in the embodiments of the present invention as shown in FIGS. 2 to 4 is detected as follows.

Figure 5:
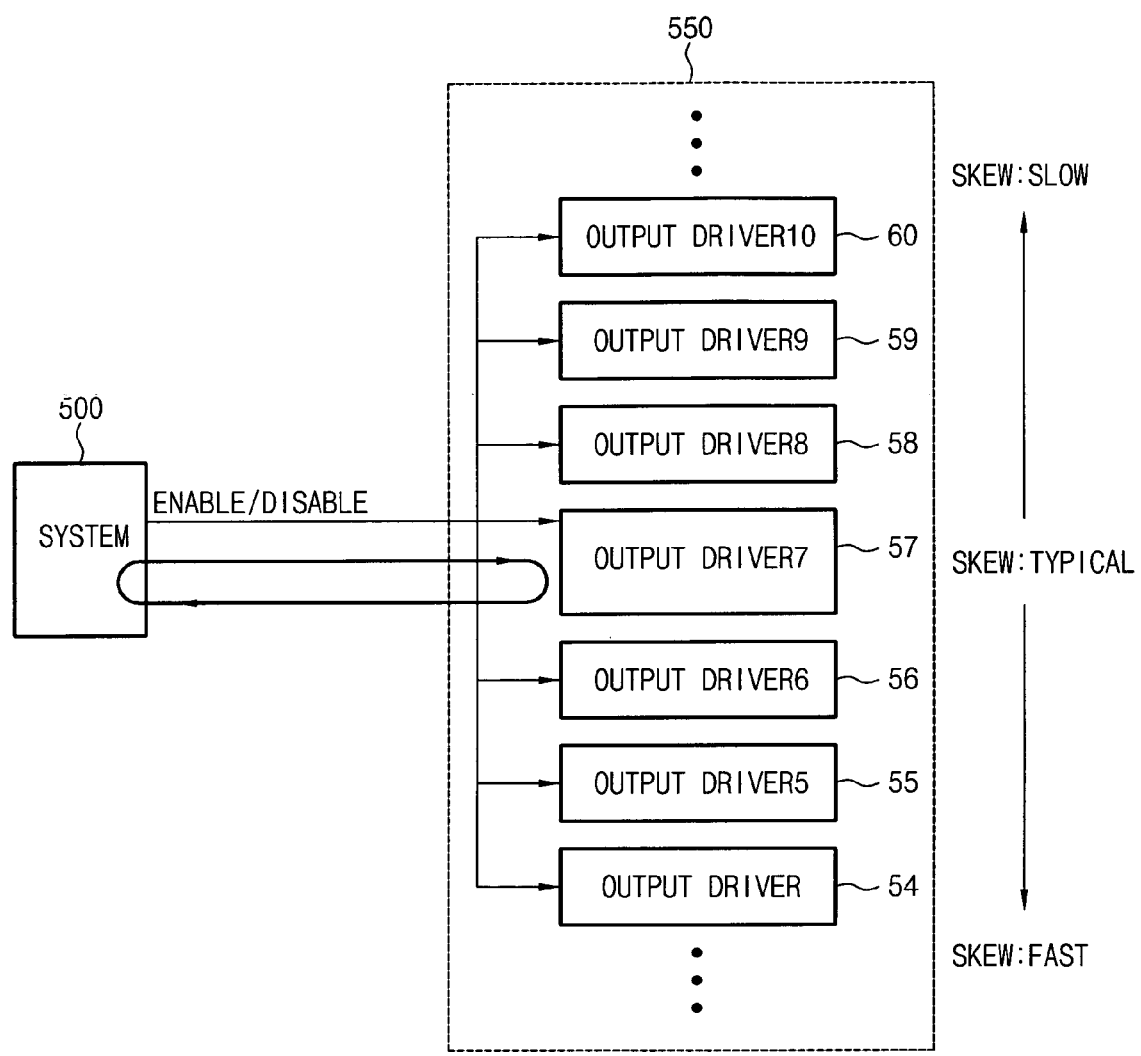
FIG. 5 is a view illustrating a process of detecting off-chip driver information.

Referring to FIG. 5, the semiconductor device 550 includes a plurality of output drivers 54, 55, 56, 57, 58, 59 and 60.

In FIG. 5, a system (for example, a memory controller 500) confirms the state of the semiconductor device 550 (i.e., the skew due to the difference in fabricating process) and determines the driving size of the respective output driver according to the confirmed state of the semiconductor device.

For example, the system detects the impedance of the output driver by testing the state of the semiconductor device. Since the output impedance of the output driver is not constant due to the variation of the fabricating process, the off-chip driver information obtained therefrom has the skew according to the fabricating process of the semiconductor device.

For example, if the skew is fast (this case means that the driving capability of the semiconductor device composed of the output drivers is large), it is required to reduce the size of the output drivers. By contrast, if the skew is slow (this case means that the driving capability of the semiconductor device composed of the output drivers is small), it is required to supplement the driving capability of the output drivers.

If the skew is fast as a result of test performed by the system 500, the size of the output drivers can be reduced through reduction of the number of operable output drivers. By contrast, if the skew is slow, the size of the output drivers can be increased through increasing of the number of the operable output drivers.

Figure 6:
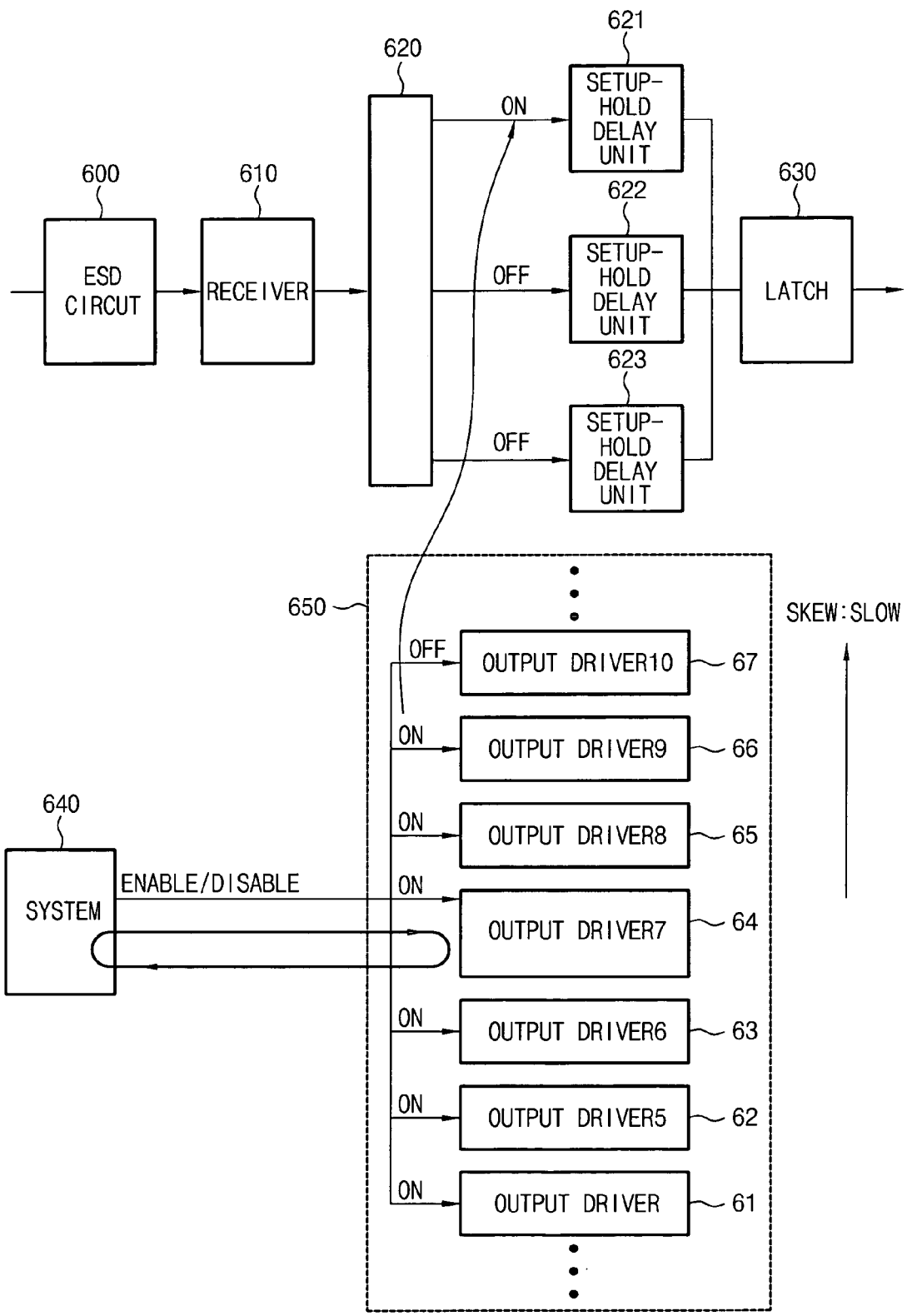
FIG. 6 is a view illustrating a method of determining a path of an input signal applied to an input device if it is judged that skew is slow as a result of an off-chip driver test.
Figure 7:
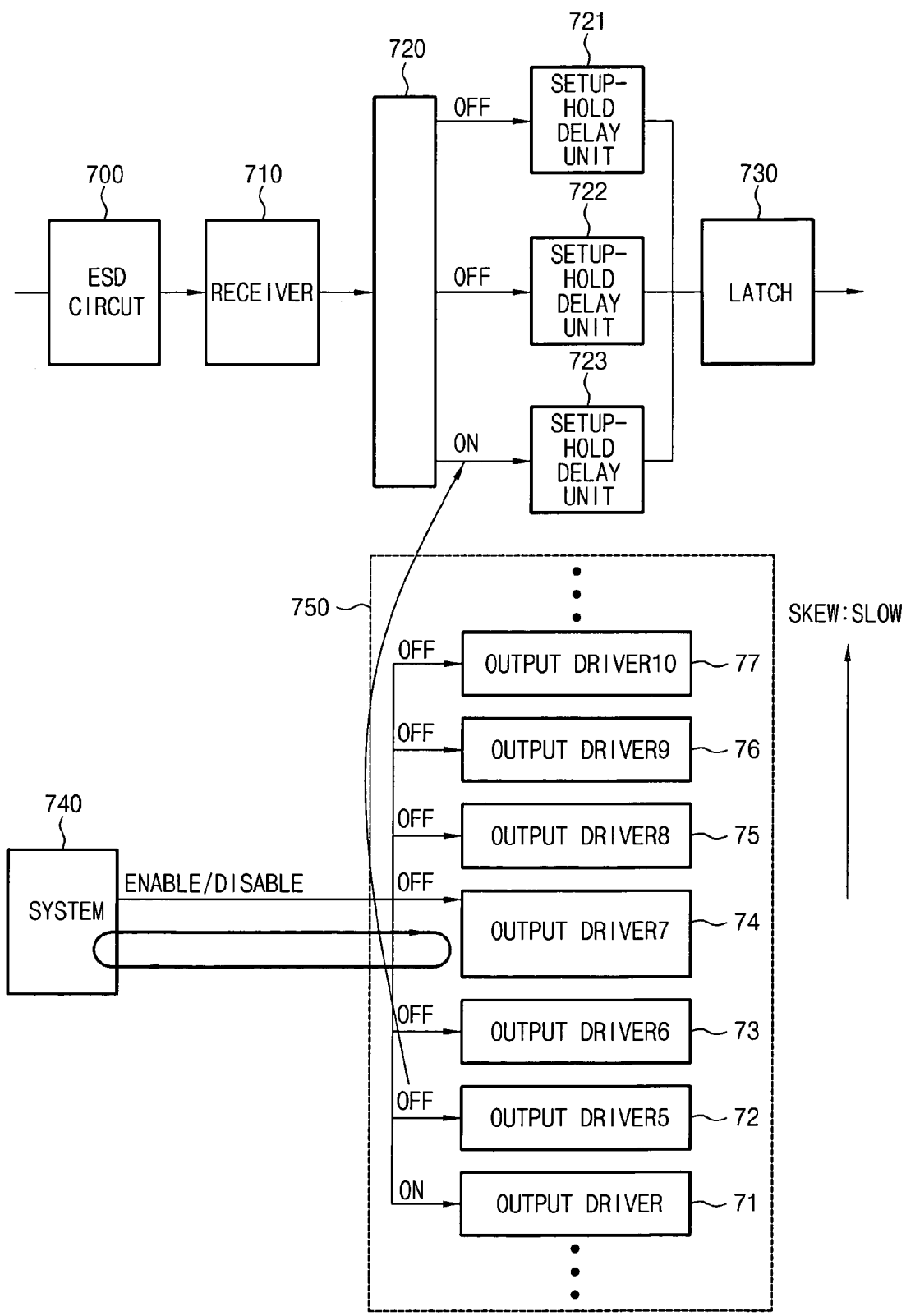
FIG. 7 is a view illustrating a method of determining a path of an input signal applied to an input device if it is judged that skew is fast as a result of an off-chip driver test.

Information corresponding to the number of output drivers (i.e., impedance) selected as described above may be provided as the off-chip driver information. With reference to FIGS. 6 and 7, the method of providing the off-chip driver information will be described. The embodiments of FIGS. 6 and 7 correspond to the second embodiment of FIG. 3.

FIG. 6 is a view illustrating a method of determining a path of an input signal applied to an input device if it is judged that skew is slow as a result of an off-chip driver test.

The input device of FIG. 6 includes an ESD circuit 600, a receiver 610, a switching unit 620, setup-hold delay units 621, 622 and 623 connected in parallel with one another and a latch 630.

The setup-hold delay unit 621 has the shortest delay time and the setup-hold delay unit 623 has the longest delay time. The setup-hold delay unit 622 has an intermediate delay time that is between the delay time of the setup-hold delay unit 621 and the delay time of the setup-hold delay unit 623.

The system 640 judges the degree of the skew occurring in the semiconductor device fabricating process by measuring the impedance values of output terminals of output drivers 61 to 67 of the memory device. FIG. 6 shows the case that the skew is judged to be slow. In this case, it is assumed that, for example, the output driver 66 is additionally enabled in order to increase the driving capability of the output drivers. Then, the off-chip driver information is transferred to the switching unit 620, and the setup-hold delay unit 621 of the input device is selected.

FIG. 7 is a view illustrating a method of determining a path of an input signal applied to an input device if it is judged that skew is fast as a result of an off-chip driver test.

The input device of FIG. 7 includes an ESD circuit 700, a receiver 710, a switching unit 720, setup-hold delay units 721, 722 and 723 connected in parallel with one another and a latch 730.

In FIG. 7, the setup-hold delay unit 721 has the shortest delay time and the setup-hold delay unit 723 has the longest delay time. The setup-hold delay unit 722 has an intermediate delay time that is between the delay time of the setup-hold delay unit 721 and the delay time of the setup-hold delay unit 723.

The system 640 judges the degree of the skew occurring in the semiconductor device fabricating process by measuring the impedance values of output terminals of output drivers 71 to 77 of the memory device. FIG. 7 shows the case that the skew is judged to be fast. In this case, it is assumed that, for example, the output driver 72 is disabled in order to decrease the driving capability of the output drivers. Then, the off-chip driver information is transferred to the switching unit 720, and the setup-hold delay unit 721 of the input device is selected.

The present invention can be applied to all input devices of the semiconductor device. Specifically, although it is described that the input deice has the ESD circuit and the buffers, the present invention can be applied to an input device having no ESD circuit. Also, the buffer construction can be modified in diverse form by those skilled in the art. Data, address and test signals can be applied to the input device of the present invention.

As described above, according to the present invention, the signal transfer path of the input device can optionally be selected using the off-chip driver information of the output drivers. Consequently, even if the performance characteristic of the semiconductor device is changed due to the skew occurring in the fabricating process of the semiconductor device, a stable input/output operation of the semiconductor device can be achieved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An input device for a semiconductor device, comprising:
    at least two buffers, connected in parallel to an electrostatic discharge (ESD) circuit, said buffers delaying an input signal applied to the semiconductor device through the ESD circuit, the buffers having delay times different from each other;
    wherein one of the buffers is selected using off-chip driver information detected from an output driver and the input signal is transferred through the selected buffer.

2. The input device as claimed in claim 1, wherein if the semiconductor device skew is fast, the buffer having a longer delay time is selected.

3. The input device as claimed in claim 1, wherein if the semiconductor device skew is slow, the buffer having a shorter delay time is selected.

4. An input device for a semiconductor device, comprising:
    a switching unit for receiving an input signal through an electrostatic discharge (ESD) circuit and performing a switching operation of the input signal according to off-chip driver information detected from an output driver; and
    at least two buffers connected in parallel to the switching unit, having delay times different from each other and buffering the transferred input signal;
    wherein the switching unit selects one of the buffers according to the off-chip driver information and transfers the input signal through the selected buffer.

5. The input device as claimed in claim 4, wherein if skew of the semiconductor device is fast, the buffer having the longer delay time is selected according to the off-chip driver information.

6. The input device as claimed in claim 4, wherein if skew of the semiconductor device is slow, the buffer having the shorter delay time is selected according to the off-chip driver information.

7. An input device for a semiconductor device, comprising:
    a receiver for receiving and converting an input signal inputted from an outside through an electrostatic discharge (ESD) circuit into an internal voltage;
    a switching unit for performing a switching operation of the input signal according to off-chip driver information detected from an output driver;
    at least two setup-hold delay units connected in parallel to the switching unit, having delay times different from each other and adjusting a setup time and a hold time of the transferred input signal; and
    a latch for latching signals outputted from the at least two setup-hold delay units;
    wherein the switching unit selects one of the setup-hold delay units according to the off-chip driver information and transfers the input signal through the selected setup-hold delay unit.

8. The input device as claimed in claim 7, wherein if skew of the output driver of the semiconductor device is fast, the setup-hold delay unit having the longer delay time is typical is selected according to the off-chip driver information.

9. The input device as claimed in claim 7, wherein if skew of the output driver of the semiconductor device is slow, the setup-hold delay unit having the shorter delay time is selected according to the off-chip driver information.

10. An input device for a semiconductor device, comprising:
    a receiver for receiving and converting an input signal inputted from an outside through an electrostatic discharge (ESD) circuit into an internal voltage;
    at least two setup-hold delay units, connected in series, for adjusting a setup time and a hold time of the input signal;
    at least two switching units connected in parallel to the setup-hold delay units in a one-to-one manner, for performing a switching operation so as to include the corresponding setup-hold delay unit as a path according to off-chip driver information detected from an output driver; and
    a latch for latching signals outputted from the final-stage setup-hold delay unit;
    wherein the switching unit selects at least one of the setup-hold delay units according to the off-chip driver information and transfers the input signal through the selected setup-hold delay unit.

11. The input device as claimed in claim 10, wherein if skew of the output driver of the semiconductor device is fast, the number of setup-hold delay units selected by the switching units is greater than the number of setup-hold delay units that are selected when the skew of the output driver of the semiconductor device is slow.

12. The input device as claimed in claim 10, wherein if skew of the output driver of the semiconductor device is slow, the number of setup-hold delay units selected by the switching units is less than the number of setup-hold delay units that are selected when the skew of the output driver of the semiconductor device is fast.

13. The input device as claimed in claim 10, wherein the respective setup-hold delay units have the same delay time.

14. The input device as claimed in claim 10, wherein the respective setup-hold delay units have delay times different from one another.

* * * * *